(12) United States Patent
Ueda

(10) Patent No.: US 6,299,363 B1
(45) Date of Patent: Oct. 9, 2001

(54) SUBSTRATE PROCESSING APPARATUS

(75) Inventor: Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/609,666

(22) Filed: Jul. 3, 2000

(30) Foreign Application Priority Data

Jul. 5, 1999 (JP) .................................................. 11-190320

(51) Int. Cl.$^7$ .................................................. G03D 5/00
(52) U.S. Cl. .................................................. 396/611; 414/935
(58) Field of Search .................................. 396/604, 611, 396/627; 118/52, 316, 319, 320, 500, 716; 414/935–937, 940, 941, 225, 416; 134/1, 2, 4, 157, 902; 29/25.01

(56) References Cited

U.S. PATENT DOCUMENTS

| | | |
|---|---|---|
| 4,985,722 | 1/1991 | Ushijima et al. ............... 396/611 |
| 5,664,254 | 9/1997 | Ohkura et al. .................. 396/611 |
| 5,844,662 | 12/1998 | Akimoto et al. ................ 396/611 |
| 5,942,013 | 8/1999 | Akimoto ......................... 396/611 |
| 6,126,703 | * 10/2000 | Akimoto et al. ................ 414/935 |

* cited by examiner

*Primary Examiner*—D. Rutledge
(74) *Attorney, Agent, or Firm*—Oblon, Spivak, McClelland, Maier & Neustadt, P.C.

(57) ABSTRACT

A processing station, an interface station, and an aligner are connected in this order to a cassette station in which a wafer cassette is carried in and out. In the processing station, shelf units on the cassette station side, processing sections including an antireflection film forming unit, a coating unit, and a developing unit on the interface station side, and wafer transfer means between the shelf units and the processing sections are all arranged parallel to the direction of arrangement of cassettes. In such a layout, processing sections can be added without changing the length from the cassette station of the processing station.

14 Claims, 11 Drawing Sheets

SUBSTRATE PROCESSING APPARATUS

CROSS-REFERENCE TO RELATED APPLICATIONS

This application is based upon and claims the benefit of priority from the prior Japanese Patent Application No. 11-190320, filed Jul. 5, 1999, the entire contents of which are incorporated herein by reference.

BACKGROUND OF THE INVENTION

The present invention relates to a substrate processing apparatus, for example, for performing coating processing of a resist solution, developing processing, and the like for a substrate such as a semiconductor wafer, a glass substrate for a liquid crystal display, or the like.

In photolithography in a semiconductor device fabricating process, a resist is applied to the front face of a semiconductor wafer (hereinafter referred to as a wafer), the applied resist is subjected to exposure processing in accordance with a predetermined pattern and then developing processing, whereby the predetermined pattern of resist film is formed. Such a series of processing is performed by a system in which an aligner is connected to a coating and developing apparatus.

FIG. 12 is a plan view showing a conventional example of such an apparatus, and a cassette C housing 25 substrates, for example, semiconductor wafers is carried into a cassette stage 1 in a cassette station A1. On this occasion, the cassette C housing, for example, 25 wafers W is carried into the cassette stage 1 by an automatic transfer robot, and a transfer path 10 for the automatic transfer robot is formed along the cassette stage 1 outside and near the cassette station A1.

A processing station A2 is connected to the cassette station A1, and an aligner A4 is connected to the processing station A2 with an interface station A3 between them. The processing station A2 includes, for example, two coating units 11 each for coating the wafer W with a resist solution and, for example, two developing units each for developing the exposed wafer W, and these units are arranged with two tiers each with two units perpendicularly to the direction of arrangement of the cassettes C placed in the cassette station A1 (In this example, the developing units are arranged at the lower tier).

This station A2 also includes, for example, three shelf units 12, 13, and 14, in which the wafers W are mounted at multiple tiers, and respective shelves of these units 12, 13, and 14 are structured as heating sections, cooling sections, delivery sections for the wafer W, and the like. The wafer W is transferred between the coating units 11, the developing units, and the shelf units 12, 13, and 14 by a wafer transfer means 15.

In such a system, the wafer W in the cassette C on the cassette stage 1 is taken out by a delivery arm 16, sent to the coating unit 11 via the delivery section of the shelf unit 12, and coated with the resist there. The wafer W is then transferred through the wafer transfer means 15, the delivery section of the shelf unit 13, the interface station A3, and the aligner A4 so as to be exposed to light. The exposed wafer W is transferred to the processing station A2 by the reverse route, and after being developed in the developing unit which is not illustrated but provided at the bottom of the coating unit 11, the wafer W is transferred through the wafer transfer means 15, the delivery section of the shelf unit 12, and the cassette C. Incidentally, the numeral 17 is a delivery arm for delivering the wafer W between the processing station A2 and the aligner A4.

In the aligner A4, however, exposure of a circuit forming area is shifted and thereby the shape of a pattern deteriorates if the aligner vibrates during processing. Accordingly, a foundation is provided at the lower end side of the aligner, and the aligner is placed on this foundation, thereby preventing the vibration of the aligner.

Meanwhile, in the aforesaid coating and developing apparatus, when it is thought to increase the numbers of the coating units 11 and the developing units in order to improve a throughput, it is common to add units in a direction orthogonal to the direction of the arrangement of the cassette C in the cassette station A1. Also, there is the thought that only the coating units 11 are disposed in the processing station A2 and that a processing station including developing units is added at the next tier.

In such methods, however, if systems are added in any case, the distance between the transfer path 10 for the automatic transfer robot and the aligner A4 is lengthened. Hence, when the systems are added, the transfer path for the automatic transfer robot needs to be formed again in a different area, which causes a disadvantage that construction work increases in addition to work for the addition of the units and the processing station, resulting in a lot of trouble.

BRIEF SUMMARY OF THE INVENTION

The present invention is made under these circumstances, and its object is to provide a substrate processing apparatus in which the length of a processing station in a direction orthogonal to the direction of arrangement of substrate cassettes does not change even if processing sections are added.

To this end, a substrate processing apparatus of the present invention is characterized by comprising: a cassette station including a mounting section for mounting a cassette housing substrates thereon and delivery means for receiving and sending the substrate from/to the cassette mounted on the mounting section; and a processing station, connected to the cassette station, for processing the substrate transferred by the delivery means, the processing station including a plurality of processing sections arranged in a direction parallel to the direction of arrangement of the cassettes mounted on the mounting section.

In the aforesaid structure, since processing sections are added in the direction parallel to the direction of arrangement of the cassettes, the length of the processing station in a direction orthogonal to the direction of arrangement of the cassettes does not change even if the processing sections are added. Thus, the processing sections can be added without changing the location of a transfer path for an automatic transfer robot for carrying the cassette into/out of the mounting section.

In the above case, the processing station is structured to include a plurality of substrate transfer means for receiving and sending the substrate from/to the processing sections and a shelf section in which a plurality of pre- and post-processing sections for performing pre-processing and/or post processing for processing in the processing sections are vertically arranged. More specifically, the shelf section is arranged on the cassette station side in a direction parallel to the direction of arrangement of the processing sections, the processing sections are arranged to face the shelf section on the opposite side to the cassette station side, and the substrate transfer means arranged to face the shelf section and the processing sections between the shelf section and the processing sections. In this case, at least one of the substrate transfer means is structured to be allowed to receive and send the substrate from/to both of the adjacent two processing sections.

Further, in the substrate processing apparatus in the present invention, when two or less substrate transfer means are provided, it is preferable that the shelf section includes an input delivery section for delivering the substrate from the cassette station to the processing station and an output delivery section for delivering the substrate from the processing station to the cassette station separately, and when three or more substrate transfer means are provided, it is preferable that one of the shelf sections on both sides as seen from the cassette station includes an input delivery section for delivering the substrate from the cassette station to the processing station and that the other shelf section includes an output delivery section for delivering the substrate from the processing station to the cassette station. In the aforesaid structure, a transfer route of the substrate is simplified, which makes it possible to avoid waste in transfer and to shorten the substrate transfer time.

The processing section in the present invention is to perform coating processing for the substrate, and more specifically the substrate processing apparatus in the present invention further comprises an aligner provided on the opposite side to the cassette station of the processing station and an interface station, connected to the side opposite to the cassette station of the processing station, for delivering the substrate between the processing station and the aligner, and the processing sections are structured to include a processing section for performing coating processing of a resist solution for the substrate and a processing section for performing developing processing for the substrate exposed in the aligner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
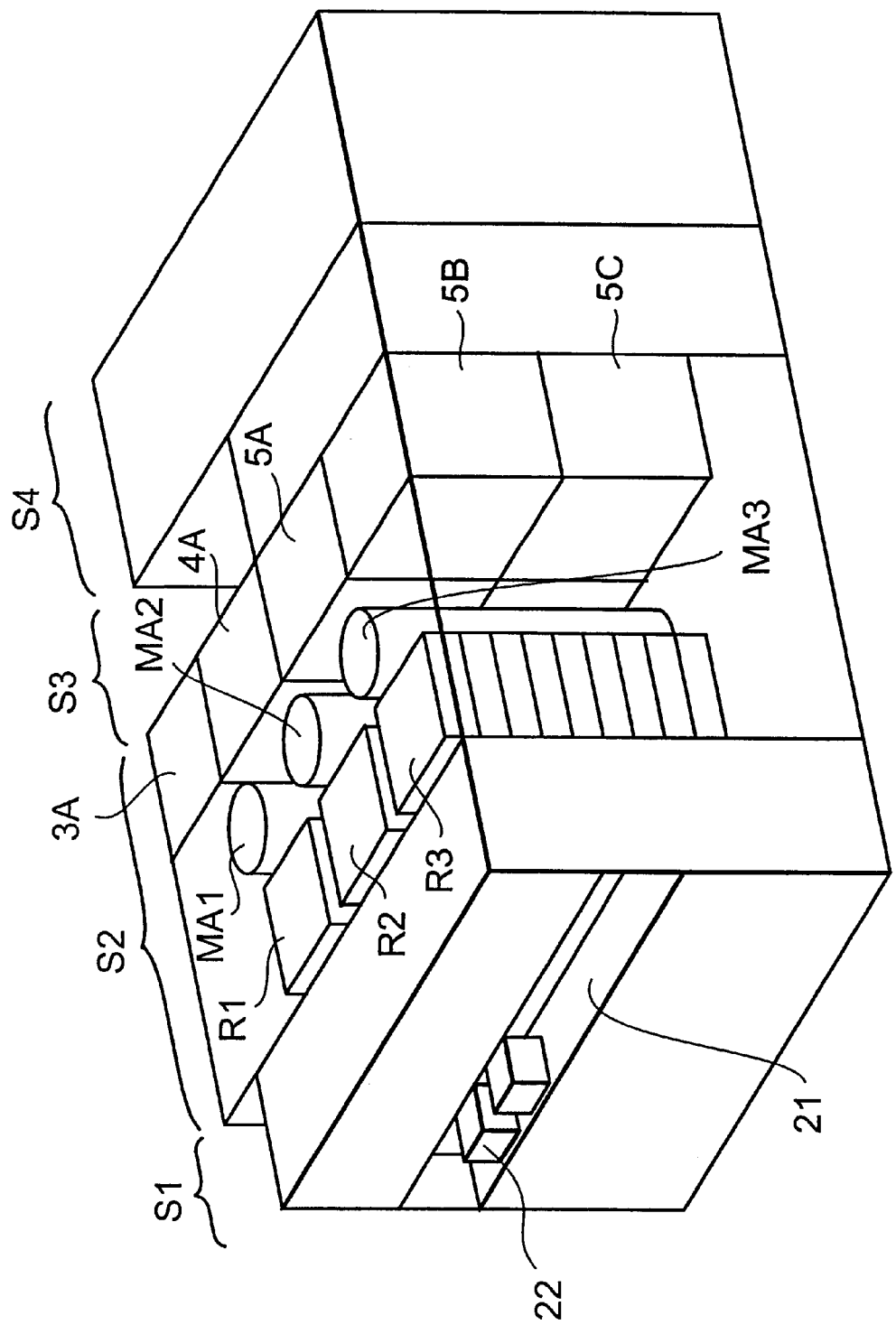
FIG. 1 is a general view showing a coating and developing apparatus according to an embodiment of the present invention.
Figure 2:
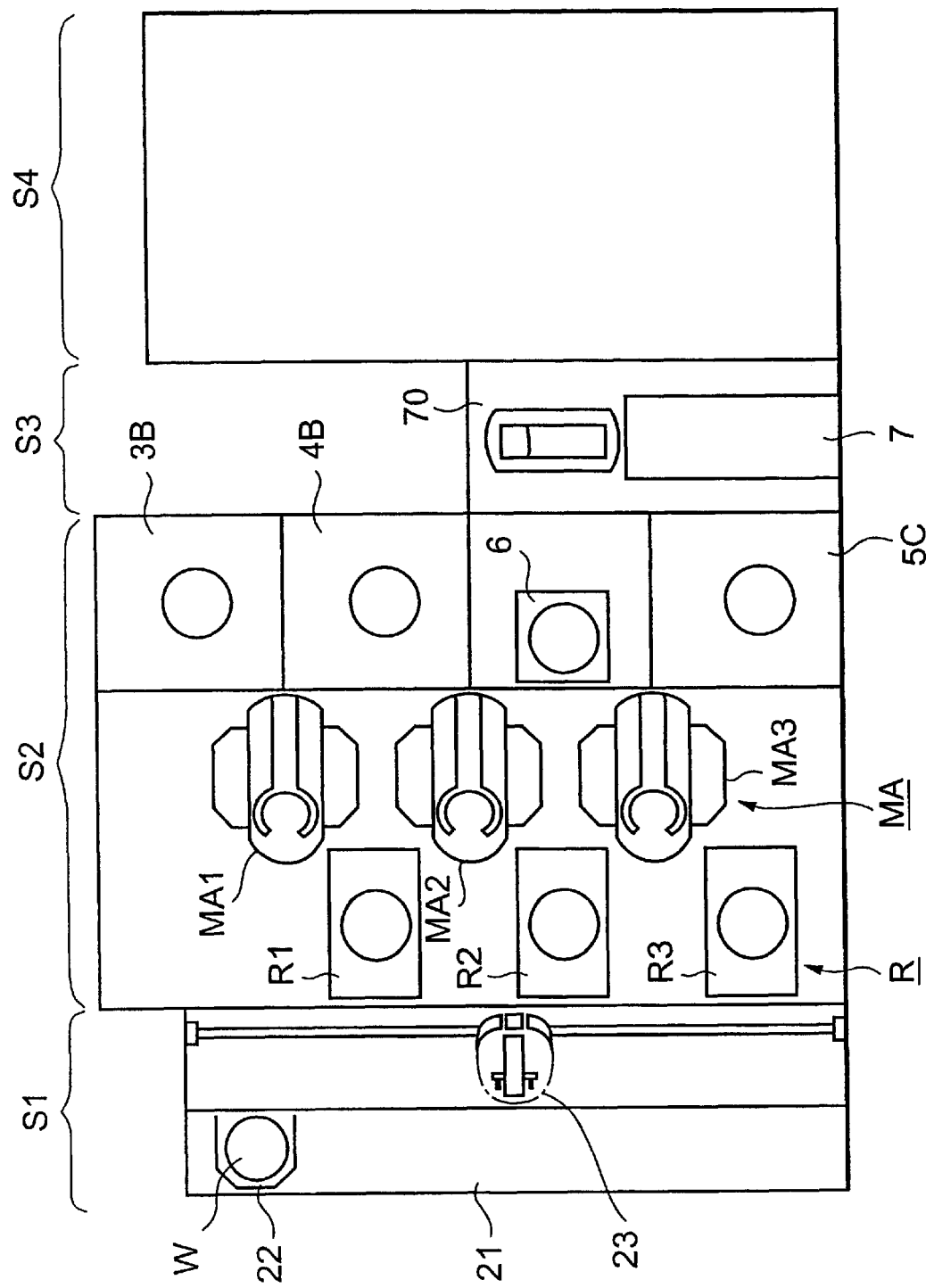
FIG. 2 is a schematic plan view showing the coating and developing apparatus.

A Preferred embodiment in which the present invention is applied to a coating and developing apparatus for a substrate will be described below. FIG. 1 is a general view showing the inside of this embodiment in perspective, and FIG. 2 is a schematic plan view. The symbol and numeral S1 in FIGS. 1 and 2 is a cassette station, S2 is a processing station for performing resist coating processing, a developing processing, and the like for a wafer W, S3 is an interface station, and S4 is an aligner.

The cassette station S1 includes a cassette stage 21 constituting a mounting section on which, for example, four wafer cassettes (hereinafter referred to as "cassettes") 22 constituting substrate cassettes each housing a plurality of substrates, for example, 25 wafers W are mounted and a delivery arm 23 constituting a delivery means for delivering the wafer W between the cassette 22 on the cassette stage 21 and a delivery section of the processing station S2 which will be described later. The delivery arm 23 is structured to be ascendable and descendable, movable in an X-direction and a Y-direction, and rotatable around a vertical axis.

Figure 3:
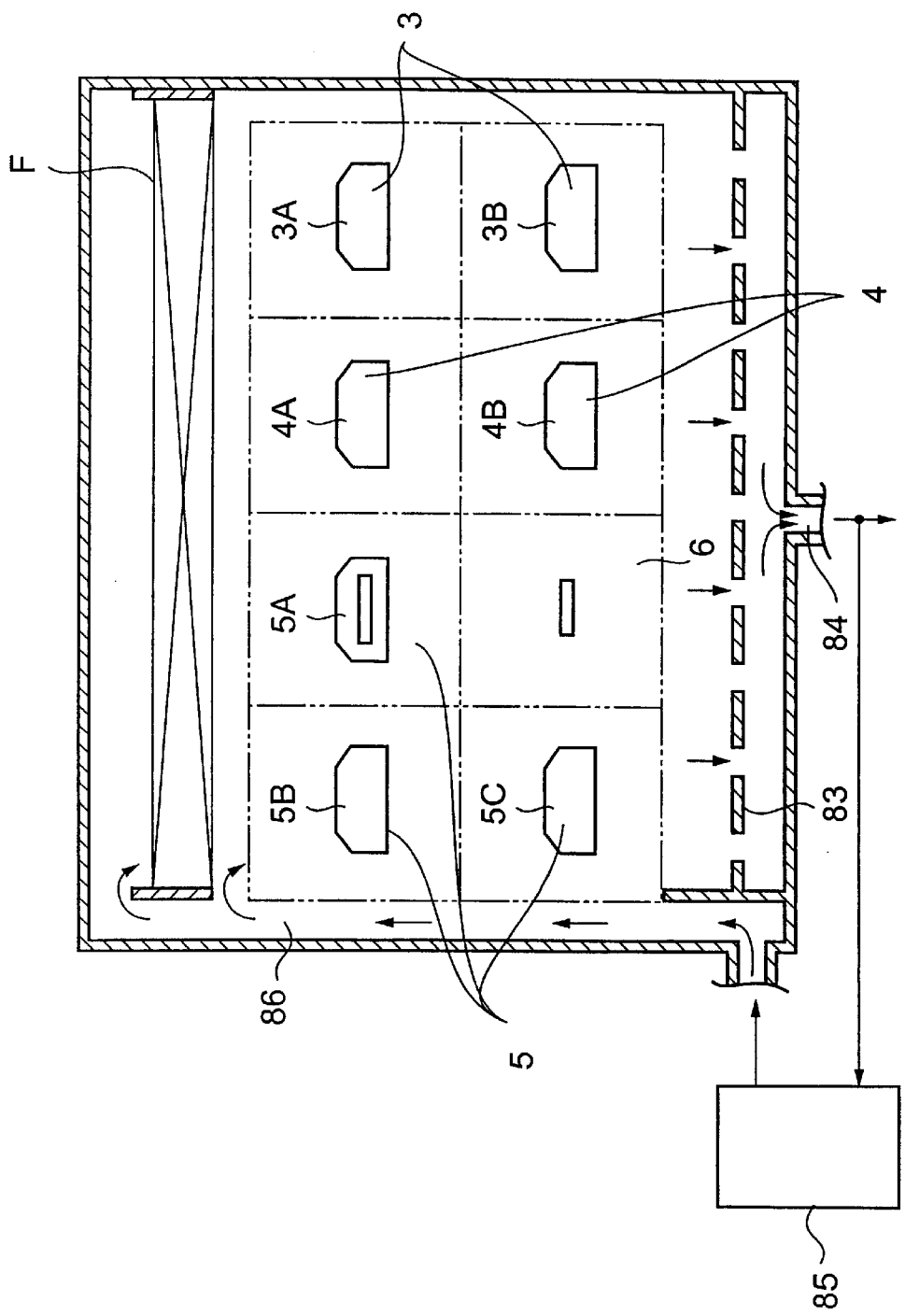
FIG. 3 is a sectional view of a processing station of the coating and developing apparatus as seen from a developing unit side.

As shown in FIG. 3 (a sectional view of the processing station S2 as seen from the aligner S4 side), the processing station S2 is structured to include, for example, two anti-reflective coating film forming units 3 (3A and 3B), for example, two coating units 4 (4A and 4B), for example, three developing units 5 (5A, 5B, and 5C), a plurality of, for example, three shelf units R (R1, R2, and R3) each being a shelf section having multi-tiered shelves, a plurality of, for example, three wafer transfer means MA (MA1, MA2, and MA3) each being a substrate transfer means, and a delivery unit 6 for the wafer W, to transfer the wafer W between the cassette station S1 and the interface station S3, and to perform processing of forming an anti-reflective coating film on the wafer W, processing of coating the wafer W with a resist, processing of developing the wafer W, and processing of heating and cooling the wafer W to predetermined temperatures as pre-processing or post-processing for the aforesaid processing therein.

An example of the layout of the inside of this station S2 will be explained. In an area adjacent to the cassette station S1 in the station S2, the three shelf units R (R1, R2, and R3) are arranged side by side in a direction parallel to the direction of arrangement of the cassettes 22 in the cassette station S1, and, for example, the shelf units R1, R2, and R3 are laid out to be arranged in this order from the left side when seen from the cassette station S1.

In an area adjacent to the interface station S3 at the back of the shelf units R as seen from the cassette station S1, for example, a plurality of, for example, eight processing sections are provided. These processing sections, for example, are arranged with two tiers each with four processing sections in a direction parallel to the direction of arrangement of the shelf units R. It should be mentioned that in explanation hereafter the cassette station S1 side is taken as the front and the aligner S4 side is taken as the back.

As shown in FIG. 3, for example, vertically two-tiered processing sections on the left side as seen from the cassette station S1 are allocated to the two anti-reflective coating film forming units 3A and 3B, and vertically two-tiered processing sections on the right side of the anti-reflective coating film forming units 3 as seen from the cassette station S1 are allocated to the two coating units 4A and 4B. Moreover, the lower section of the processing sections on the right side of the coating units 4 as seen from the cassette station S1 is allocated to the developing unit 6, and the remaining processing sections are allocated to the developing units 5. In this example, the antireflection film forming unit 3A and the coating unit 4A are disposed at the upper tier of the processing sections, the delivery unit 6 is disposed at the bottom of the developing unit 5A, the developing unit 5C is disposed adjacent to the delivery unit 6, and the developing unit 5B is disposed on top of the developing unit 5C.

The three wafer transfer means MA are structured to be movable back and forth, ascendable and descendable, and rotatable around a vertical axis as will be described later, and laid out at positions where the wafer W can be received and sent from/to all shelves of the shelf units R and all processing units by any of the wafer transfer means MA.

The wafer transfer means MA, for example, are arranged in a row in a direction parallel to the direction of arrangement of the shelf units R in an area between the shelf units R and the processing sections, and disposed so that one wafer transfer means MA can get access to one or two adjacent shelf units R and adjacent processing sections with two tiers each with two sections (four processing sections). More specifically, in this example, for example, the wafer transfer means MA1, MA2, and MA3 are disposed in this order from the left side when seen from the cassette station S1, and laid out so that the wafer transfer means MA1 can get access to the shelf unit R1, the antireflection film forming units 3, and the coating units 4, the wafer transfer means MA2 can get access to the shelf units R1 and R2, the coating units 4, the delivery unit 6, and the developing unit 5A, and that the wafer transfer means MA3 can get access to the shelf units R2 and R3, the delivery unit 6, and the developing units 5.

Figure 4:
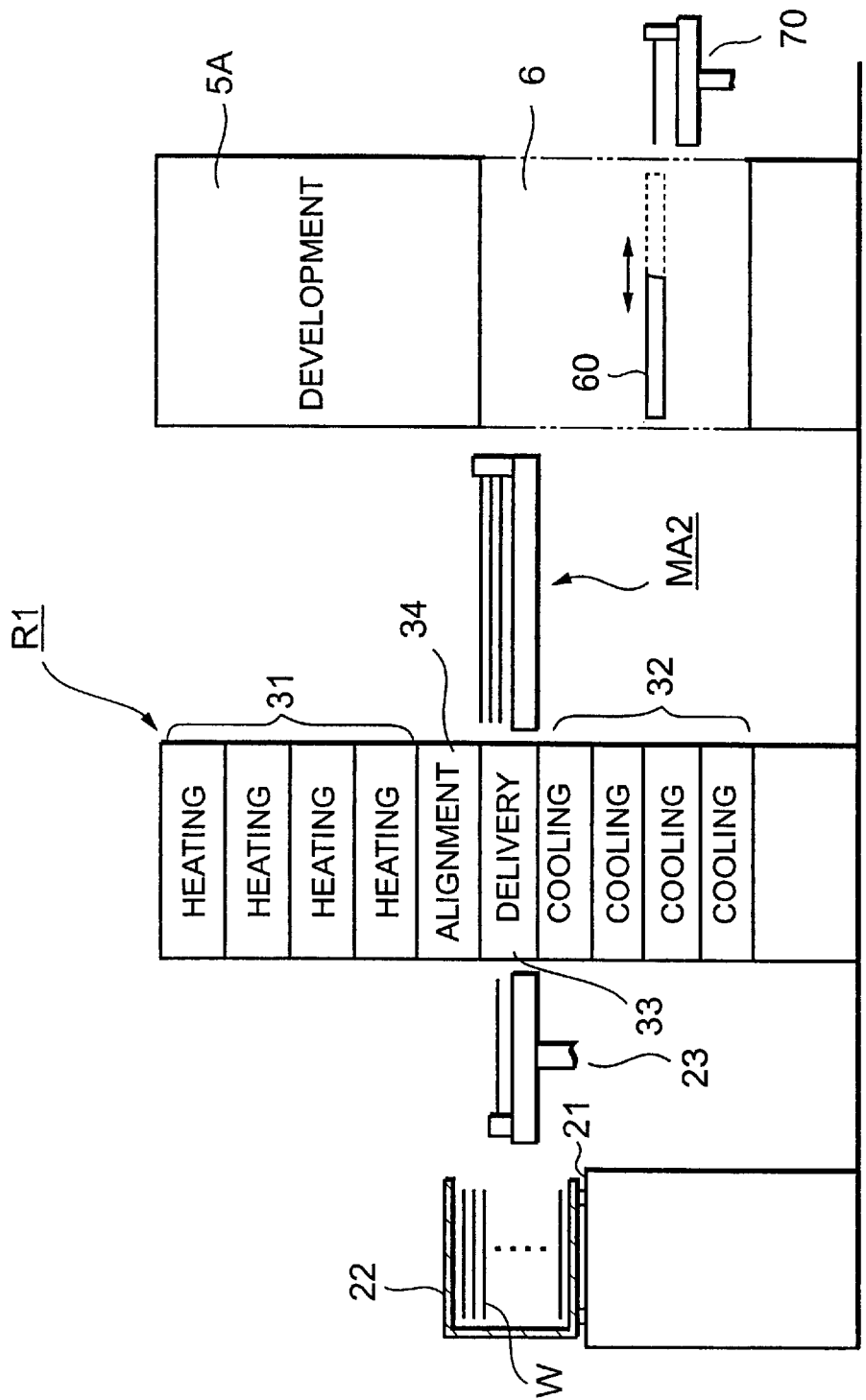
FIG. 4 is a side view showing an example of each of a shelf unit, a wafer transfer means, and a processing section.

As shown with the shelf unit R1 as a representative in FIG. 4, in each of the shelf units R (R1, R2, and R3), a plurality of heating sections 31 each for heating the wafer W, a plurality of cooling sections 32 each for cooling the wafer W, and a delivery section 33 including a delivery table for receiving and sending the wafer W from/to the cassette station S1 and delivering the wafer W between the wafer transfer means MA are vertically arranged. Moreover, in one shelf unit R1, an alignment section 34 for aligning the wafer W is provided.

In the heating section 31, the wafer W is heated to a predetermined temperature by mounting the wafer W on the front face of a hot plate heated, for example, by a heater. In the cooling section 32, the wafer W is cooled to a predetermined temperature by mounting the wafer W on the front face of a chill plate cooled by letting a refrigerant flow. These heating section 31 and cooling section 32 correspond to pre- and post-processing sections in the present invention. Further, three wafer transfer means MA are provided in this example, and therefore the delivery sections 33 of both the outer shelf units R1 and R3 out of the shelf units R are used for receiving and sending the wafer W from/to the cassette station S1. Namely, the delivery section 33 of one shelf unit R1, for example, is structured as an input delivery section for delivering the wafer W from the cassette station S1 into the processing station S2, and the delivery section 33 of the other shelf unit R3, for example, is structured as an output delivery section for delivering the wafer W from the processing station S2 to the cassette station S1.

Figure 5:
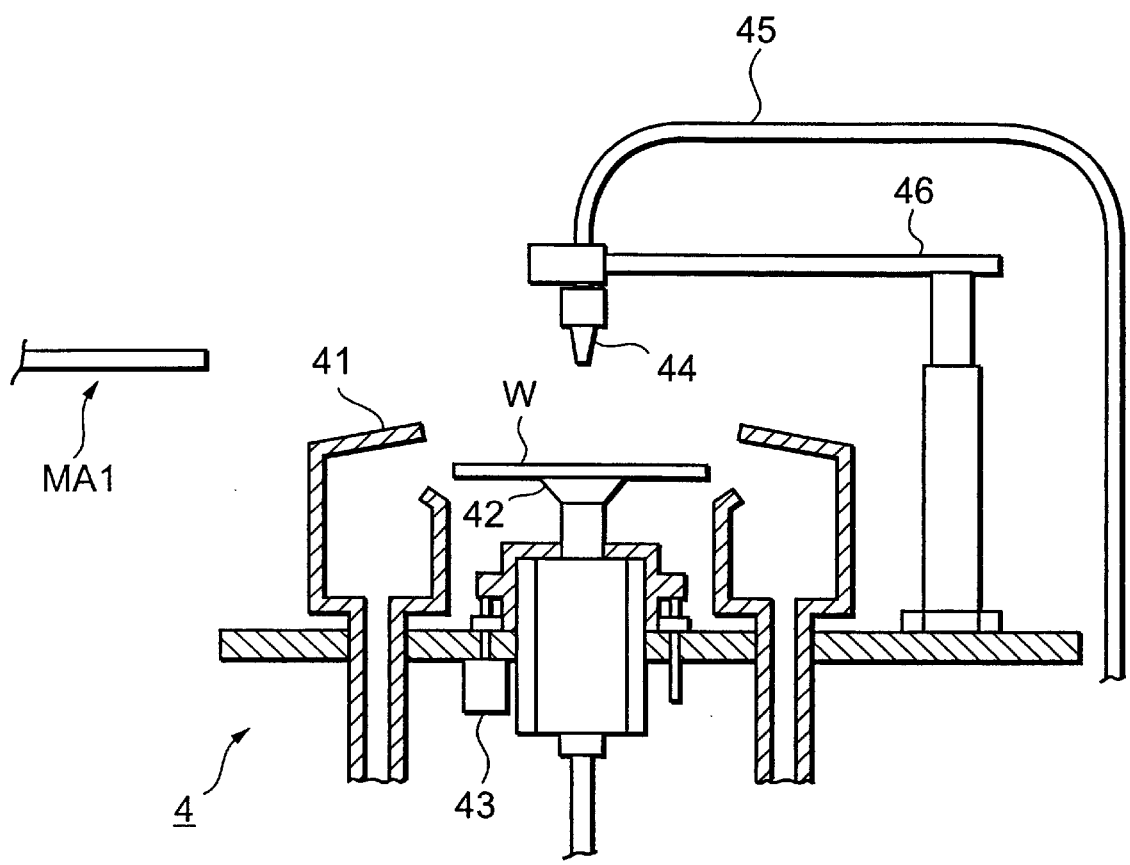
FIG. 5 is a sectional view showing a coating unit.

When the coating unit 4 is explained, for example, based on FIG. 5, the numeral 41 is a cup, and a rotatable spin chuck 42 having a function of vacuum suction is provided in the cup 41. The spin chuck 42 is structured to be ascendable and descendable by means of a raising and lowering mechanism 43, and when the spin chuck 42 is positioned at the upper side of the cup 41, the delivery of the wafer W from/to an arm 51 which will be described later of the wafer transfer means MA is performed.

As for the delivery of the wafer W, the spin chuck 42 relatively rises from the lower side of the cup 41 and receives the wafer W on the arm 51 at the upper side thereof, while the wafer W is delivered from the spin chuck 42 side to the arm by operation reverse to the above. The numeral 44 is a discharge nozzle, 45 is a resist solution supply pipe, 46 is a supporting arm for horizontally moving the nozzle. In such a coating unit 4, a resist solution being a coating solution is dropped from the discharge nozzle 44 to the front face of the wafer W on the spin chuck 42, and spread and applied over the wafer W by rotating the spin chuck 42.

The antireflection film forming unit 3 and the developing unit 5 have almost the same structure as the coating unit 4, but the developing unit 5 is structured so that the discharge nozzle 44 includes, for example, a large number of supply ports arranged in the direction of the diameter of the wafer W and that the developing solution being a coating solution is discharged from the discharge nozzle 44 to the front face of the wafer W on the spin chuck 42 and heaped up by rotating the spin chuck 42 a half turn, whereby a developing solution film is formed.

Figure 6:
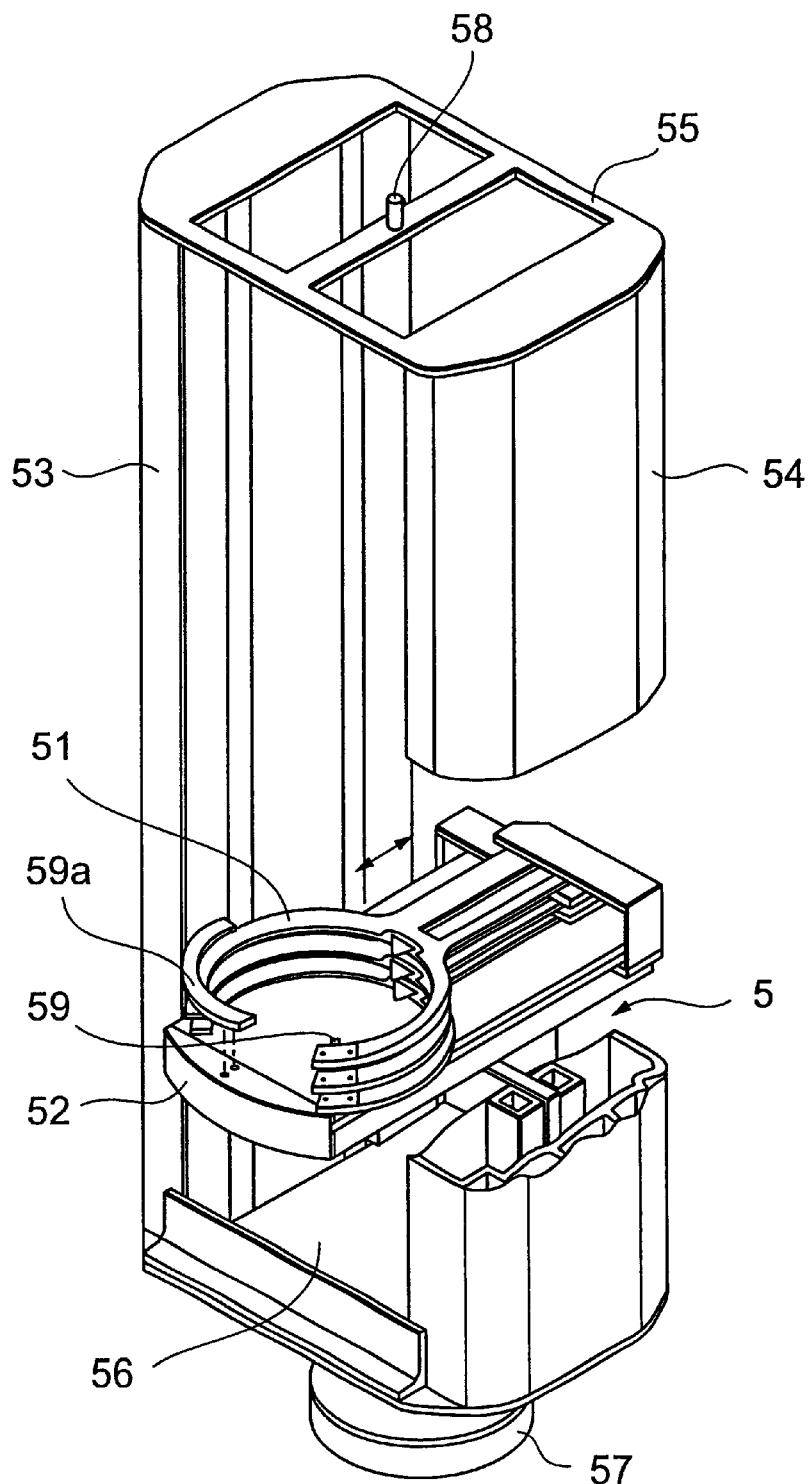
FIG. 6 is a perspective view showing the wafer transfer means.

The wafer transfer means MA1, MA2, and MA3 are structured identically, and as shown in FIG. 6, for example, each of them includes an arm 51 for holding the wafer W, a base 52 for supporting the arm 51 so that the arm can freely move forward and backward, a pair of guide rails 53 and 54 for ascendably and descendably supporting the base 52, coupling members 55 and 56 respectively for coupling the upper ends and the lower ends of the guide rails 53 and 54, a rotational drive portion 57 integrally attached to the coupling member 56 at the lower ends of the guide rails for driving a frame body composed of the guide rails 53 and 54 and the coupling members 55 and 56 so that the frame body can freely rotate around a vertical axis, and a rotating shaft portion 58 provided on the coupling member 55 at the upper ends of the guide rails.

The arm 51 has a three-tiered structure so as to hold the wafer W at each tier, and the peripheral edge of the wafer W is placed on, for example, three claw portions 59 provided at each tier. A base end portion of the arm 51 can move sliding along a guide groove 50 provided in the longitudinal direction of the base 52. Incidentally, the numeral and symbol 59a is a sensor supporting member to which a photosensor for detecting the presence or absence of the wafer W on the arm 51 is attached, and the sensor supporting member is fixed to the base 52.

The wafer delivery unit 6 is used for delivering the wafer W between the processing station S2 and the interface station S3, and, for example, structured so that a delivery section 60 for the wafer W is movable between a position on the cassette station S1 side and a position on the interface station S3 side. More specifically, the delivery section 60 can move between a position on the cassette section S1 side within a stroke of the arm 51 of each of the wafer transfer means MA2 and MA3 and a position on the interface station S3 side within a stroke of a delivery arm 70 which is provided in the interface station S3 and will be described later.

The delivery table 60 is provided with a plurality of pins each having such a height that the arm 51 of the wafer transfer means MA does not hit each pin at positions nearly corresponding to the center of the wafer W on the upper face of a plate, and structured so that the arm 51 is lowered after the wafer W is mounted on these pins and then withdrawn to thereby deliver the wafer W to the delivery table 60. Incidentally, the delivery sections 33 of the shelf units R are structured similarly.

Figure 7:
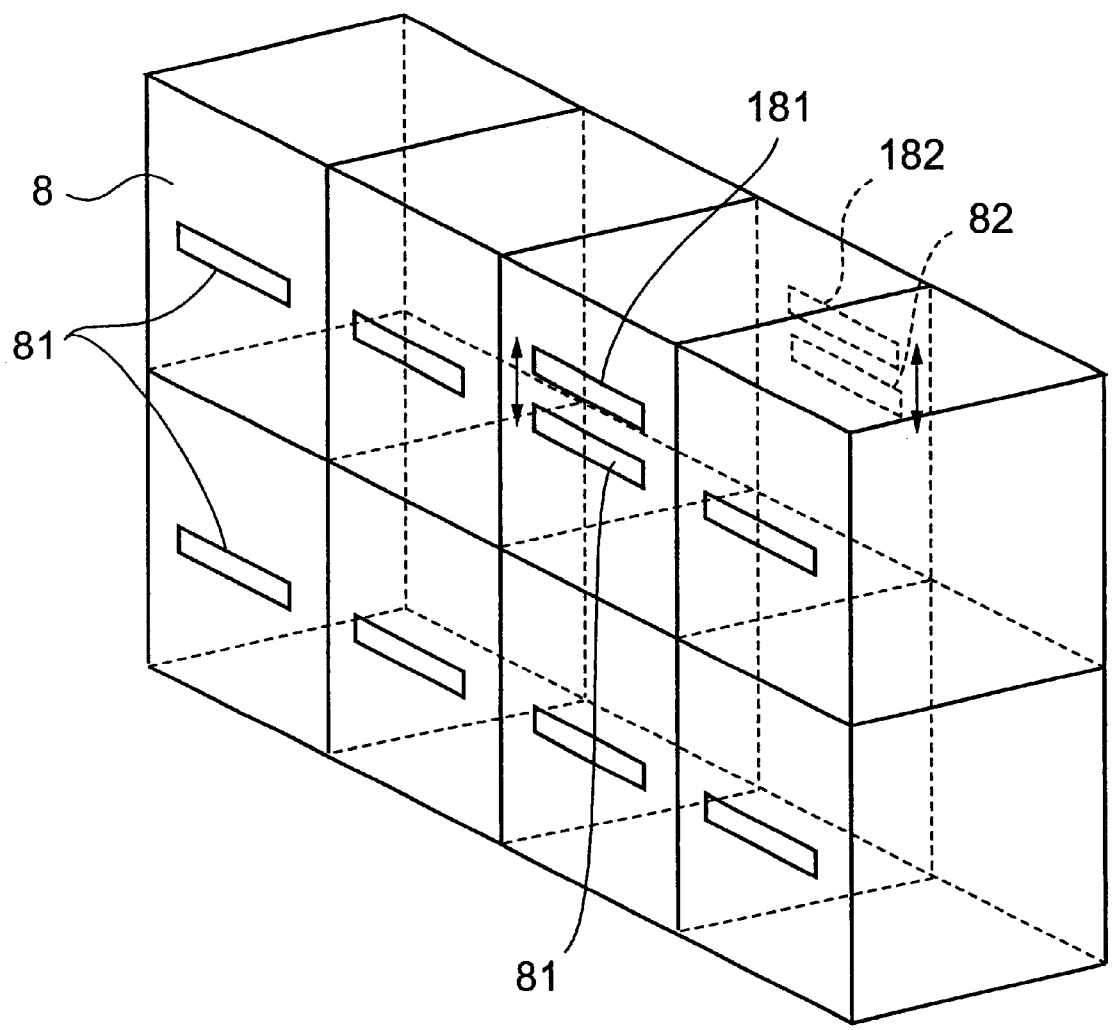
FIG. 7 is a perspective view showing the processing section.

Moreover, the processing sections are spatially closed to other areas. Namely, the processing sections are partitioned off from an area in which the wafer transfer means MA are provided by a partition wall 8 and structured so that air cleaned through a filter unit F enters the processing sections (See FIG. 3 and FIG. 7). Delivery ports 81 for the wafer W for delivering the wafer W between respective processing sections and the wafer transfer means MA, and a delivery port 83 for the wafer W for delivering the wafer W between the delivery unit 6 and a delivery arm 70 of the interface station S3 which will be described later are formed in the partition walls 8. Shutter members 181 and 182 are provided at the delivery ports 81 and 82 for the wafer W in the delivery unit 6. At least one of the shutter members 181 and 182 always closes one of the delivery ports 81 and 82 for the wafer W.

The filter unit F is provided, for example, so as to cover the upper side of the processing station S2. As shown in FIG. 3, for example, a lower atmosphere inside the processing station S2 collected through a vent hole plate 83 is exhausted to a factory exhaust system through an exhaust port 84, while a part thereof is introduced into a filter device 85, and air cleaned in the filter device 85 is sent out to a wall duct 86 formed between a side wall and the processing station and blown out as down-flowing air into the processing station S2 via the filter unit F provided under a ceiling section.

The filter unit F includes a filter for cleaning air, a chemical filter to which acid components are added to remove alkaline components in the air such as ammonia components and amine, a suction fan, a heating mechanism, a humidifying mechanism, and the like, and the air which is cleaned, from which alkaline components are removed, and which is regulated at predetermined temperature and humidity is sent out into an under processing space. When a chemically amplified resist is used as a resist solution, for example, it is required to prevent entry of alkaline components into a developing processing atmosphere, and thus the processing section is made a closed space and the entry of alkaline components from the outside is prevented by using the chemical filter.

Acids are produced by exposing the chemically amplified resist, and the acids are diffused by heat processing and act as catalyst, and as a result, decompose base resin which is the main component of a resist material or change its molecular structure to make it soluble in the developing solution. Accordingly, in the case where this kind of resist is used, when alkaline components such as a very small amount of ammonia contained in air or amine produced from paint on walls come in contact with acids on the surface portion of the resist, a catalytic reaction by the acids is suppressed, thus deteriorating the shape of a pattern. Hence, the removal of alkaline components is needed.

Thus, in the processing station S2, the wafer W is received and sent: from/to the shelf unit R1, the antireflection film forming units 3A and 3B, and the coating units 4A and 4B by the wafer transfer means MA1; from/to the shelf units R1 and R2, the coating units 4A and 4B, the delivery unit 6, and the developing unit 5A by the wafer transfer means MA2; and from/to the shelf units R2 and R3, the delivery unit 6, and the developing units 5A, 5B, and 5C by the wafer transfer means MA3.

The interface station S3 is connected adjacent to the processing station S2, and the aligner S4 for performing exposure for the wafer W on which a resist film is formed is connected at the back of the interface station S3. The interface station S3 includes CHP devices 7 each for heating and cooling the wafer W and a delivery arm 70 for delivering the wafer W between the processing station S2 and the aligner S4 and between the processing station S2 and the CHP devices 7.

The CHP device 7 includes, for example, a hot plate for heating the wafer W and a chill plate for cooling the wafer W. The wafer W is first mounted on the hot plate and heated to a predetermined temperature. Thereafter, while the wafer W is raised from the hot plate by a protruding pin, for example, the chill plate is moved to a position under the wafer W, and then the wafer W is delivered to the chill plate and mounted on the chill plate to be cooled to a predetermined temperature. Hence, in this device, heating time is controlled by the delivery of the wafer W between the hot plate and the chill plate, thereby preventing over-bake.

Figure 8:
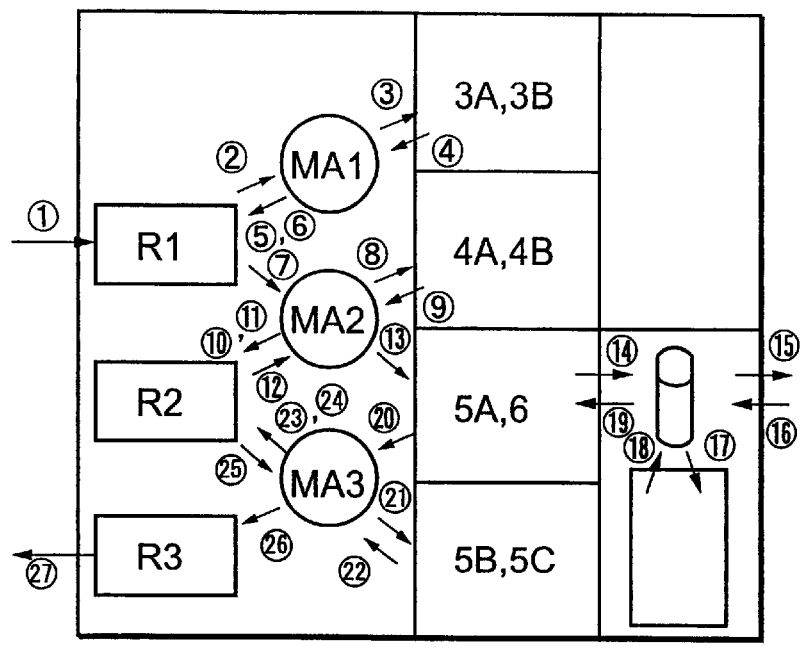
FIG. 8 is a plan view showing the flow of a wafer in the processing station.

Next, the operation of the aforesaid embodiment will be explained with reference to FIG. 8. First, the cassette 22 housing, for example, 25 wafers W is carried into the cassette stage 21 by an automatic transfer robot (or an operator), and one wafer W is taken out of the cassette 22 by the delivery arm 23 and placed on the input delivery section 33 in the shelf unit R1 in the processing station S2 (1). Subsequently, by the wafer transfer means MA1 (2), the wafer W is transferred to the antireflection film forming unit 3A (3B) (3), where an antireflection film is formed. If the chemically amplified resist is used, reflection is caused on the lower side of the resist during exposure, and hence the antireflection film is formed as above for preventing the reflection.

Subsequently, the wafer W is transferred through the wafer transfer means MA1 (4), the heating section 31 of the shelf unit R1 (5), the cooling section 32 (6), the wafer transfer means MA2 (MA1) (7), and the coating unit 4A (4B) (8), and then heated to a predetermined temperature in the heating section 31 and cooled to a predetermined temperature in the cooling section 32, and thereafter coated with the resist in the coating unit 4A (4B). The wafer W in the coating unit 4A (4B) is then transferred through the wafer transfer means MA2 (MA1) (9), the heating section 31 of the shelf unit R2, (R1, R3) (10), and the cooling section 32 (11), and then heated to the predetermined temperature in the heating section 31 and then cooled to the predetermined temperature in the cooling section 32. Thereafter, the wafer W is transferred through the wafer transfer means MA2 (MA3) (12), the delivery table 60 of the delivery unit 6 (13), the delivery arm 70 of the interface station S3 (14), and the aligner S4 (15), where exposure is performed.

The exposed wafer W is transferred by the reverse route, that is, the aligner S4, the delivery arm 70 (16), and the CHP device 7 (17), where the wafer W is heated to a predetermined temperature and then cooled to a predetermined temperature to prevent over-bake. Subsequently, the wafer W is transferred through the delivery arm 70 (18), the delivery table 60 of the delivery unit 6 (19), the wafer transfer means MA3 (MA2) (20), and the developing unit 5B (5A, 5C) (21), and then subjected to developing processing in the developing unit 5B.

Thereafter, the wafer W is transferred through the wafer transfer means MA3 (MA2) (22), the heating section 31 of the shelf unit R2 (R3) (23), the cooling section 32 (24), the wafer transfer means MA3 (25), the output delivery section 33 of the shelf unit R3 (26), and the delivery arm 23 (27), and then the wafer W cooled to the predetermined temperature after being temporarily heated to the predetermined temperature is returned into, for example, the original cassette 22 via the output delivery section 33 of the shelf unit R3.

In the processing station S2, it is desirable that the wafers W are sent to the input delivery section 33 of the shelf unit R1 one by one, each wafer W is transferred through the wafer transfer means MA1, the vacant antireflection film forming unit 3, the wafer transfer means MA1, the vacant heating section 31 of the shelf unit R1, the vacant cooling section 32, the wafer transfer means MA1 or MA2, the vacant coating unit 4, the wafer transfer means MA1 or MA2, the vacant heating section 31 of the shelf unit R1, R2, or R3, the vacant cooling section 32, the wafer transfer means MA2 or MA3, the delivery unit 6, and the interface station S3, and that the exposed wafer W is transferred by the route of the vacant CHP device 7 of the interface station S3, the delivery arm 70, the delivery unit 6, the wafer transfer means MA2 or MA3, the vacant developing unit 5, the wafer transfer means MA2 or MA3, the vacant heating section 31 of the shelf unit R2 or R3, the vacant cooling section 32, the wafer transfer means MA3, and the output delivery section 33 of the shelf unit R3. The wafer W, however, may be transferred between the shelf units R with one or two shelf units R between them and between the processing sections, in which case it is advisable that the wafer W is delivered between the wafer transfer means MA via the delivery section 33 of the shelf unit R.

Since the processing sections are arranged in the direction parallel to the direction of arrangement of the cassettes 21 in the cassette station S1 in the aforesaid embodiment, when the numbers of the antireflection film forming units 3, the coating units 4, the developing units 5 are increased, processing sections are added in the direction parallel to the direction of the cassettes 21. Therefore, without changing the length of the processing station S2 in a direction orthogonal to the cassette station S1, that is, without changing the distance between the cassette station S1 and the aligner S4, the processing sections can be added. Hence, a foundation of the aligner S4 and a transfer path for the automatic transfer robot for carrying the cassette 22 into/out of the cassette station S1 do not need to be formed again with the addition of the processing sections, which facilitates the addition of processing sections. Moreover, the depth from the cassette station S1 of the processing station S2 remains short even if processing sections are added, whereby the efficiency of utilization of a clean room can be raised.

In the aforesaid example, in the processing station S2, the shelf units R, the wafer transfer means MA, and the processing sections are arranged in this order from the cassette station S1 side, and the number of the wafer transfer means MA is three or more. Therefore, the input delivery section 33 is provided in one of the shelf units R1 and R3 at both ends as seen from the cassette station S1 side, and the output delivery section 33 is provided in the other shelf unit, thereby avoiding waste in the transfer of the wafer W. Namely, as described above, the wafer W is transferred from the shelf unit R1 by the wafer transfer means MA via the route of the unit 3, the heating section 31 and the cooling section 32 of the shelf unit R, the coating unit 4, the heating section 31 and the cooling section 32 of the shelf unit R, the delivery unit 6, the interface station S3, the aligner S4, the interface station S3, the delivery unit 6, the developing unit 5, the heating section 31 and the cooling section 32 of the shelf unit R, and the output delivery section 33 of the shelf unit R3, and then hence the wafer W does not pass units which do not perform processing for the wafer W.

Further, in the aforesaid example, for instance, after being coated with the resist in the coating unit 4, the wafer W may be heated and cooled in the CHP device 7 in the interface station S3. When the wafer w is transferred to the interface station S3 immediately after having undergone processing in the processing section as described above, the wafer W does not pass the shelf units R and the like which do not perform processing for the wafer W since the processing sections are arranged on the interface station S3 side, and consequently there is no waste in transfer. When there is no waste in transfer as above, the wafer W can be transferred in a short time, leading to improvement in throughput.

Contrary to this, in a system in which the processing sections are disposed in the direction orthogonal to the direction of arrangement of the cassettes 22 in the cassette station S1 and which the shelf units R are disposed on the cassette station S1 side and the interface station S3 side as in a prior art, if the number of processing sections increases, a processing station for coating in which the coating units 4 are disposed and a processing station for developing in which the developing units 5 are disposed are prepared, and the processing station for coating is disposed on the cassette station S1 side and the processing station for developing is disposed on the interface station S3 side respectively. In such an example, the wafer W coated with the resist is transferred to the aligner S4 after passing through the processing station for developing in which processing is not to be performed for the wafer W, and the developed wafer W is transferred to the cassette station S1 after passing through the processing station for coating in which processing is not to be performed for the wafer W, thereby causing waste in transfer. Further, when the wafer W is delivered between the adjacent processing stations, and between the wafer transfer means, the wafer W needs to pass the delivery section of the shelf unit, whereby transfer routes overlap each other, resulting in waste in transfer also from this point.

Figure 9:
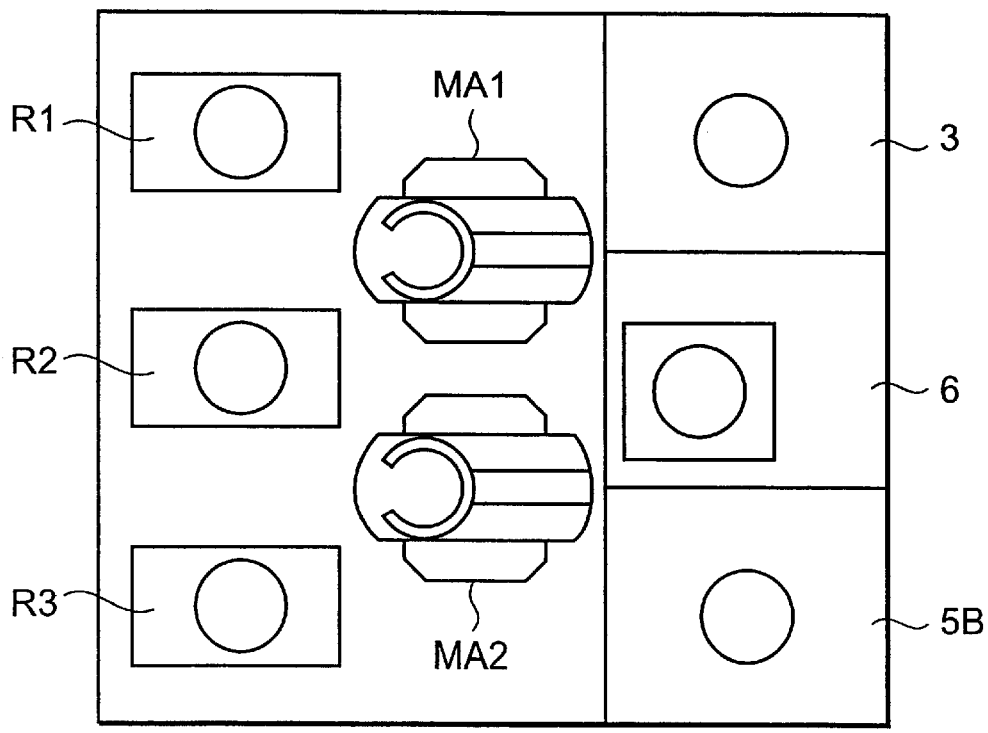
FIG. 9 is a plan view showing another example of the processing station.

The above explains the case where the number of the wafer transfer means MA is three or more, while the case where the number of the wafer transfer means MA is two or less will be explained below. FIG. 9 shows an example of the layout of the processing station S2 in the case where two wafer transfer means MA (MA1 and MA2), three shelf units R (R1, R2, and R3), processing sections with two tiers each with three sections (in this example, one antireflection film forming unit 3, one coating unit 4, one delivery unit 6, and three developing units 5) are provided. In this example, the three shelf units R are arranged in the order of the shelf units R1, R2, and R3 from the left side as seen from the cassette station S1 in the direction parallel to the direction of the arrangement of the cassettes 22 in the cassette station S1. At the back of the shelf units R as seen from the cassette station S1, the two wafer transfer means MA are arranged in the order of the wafer transfer means MA1 and MA2 from the left side as seen from the cassette station S1 in a direction parallel to the arrangement of the shelf units R.

At the back of the wafer transfer means MA as seen from the cassette station S1, the six processing sections are arranged in the direction parallel to the direction of arrangement of the shelf units R, and the upper processing section and the lower processing section on the left side as seen from the cassette station S1 are allocated to the antireflection processing unit 3 and the coating unit 4, respectively. The upper processing section and the lower processing section in the middle as seen from the cassette station S1 are allocated to the delivery unit 6 and the developing unit 5A, respectively. The two upper and lower processing sections on the right side as seen from the cassette station S1 are allocated to the developing units 5B and 5C.

Further, in this example, the input delivery section for delivering the wafer W from the cassette station S1 to the processing station S2 and the output delivery section for delivering the wafer W from the processing station S2 to the cassette station S1 are provided separately in any of the three shelf units R1, R2, and R3, for instance, in the shelf unit R2.

Such layout that the wafer W is received and sent from/to the shelf units R1 and R2, the antireflection film forming unit 3, the coating unit 4, the delivery unit 6, and the developing unit 5A by the wafer transfer means MA1, and from/to the shelf units R2 and R3, the delivery unit 6, and the developing units 5A, 5B, and 5C by the wafer transfer means MA2 is given.

Figure 10:
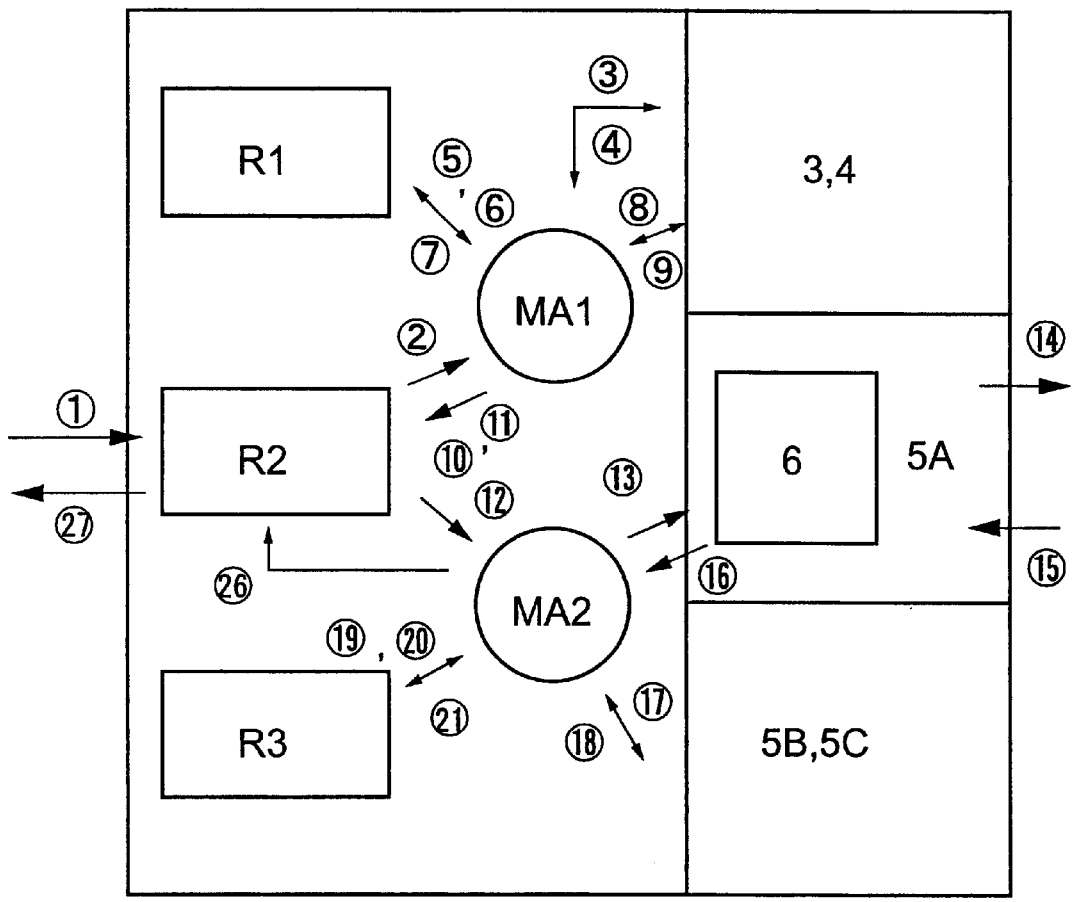
FIG. 10 is a plan view showing the flow of the wafer in the processing station.

If the flow of the wafer W in the aforesaid processing station S2 is explained based on FIG. 10, the wafer W is transferred through the input delivery section of the shelf unit R2 (1), the wafer transfer means MA1 (2), the unit 3 (3), the wafer transfer means MA1 (4), the heating section 31 of the shelf unit R1 (R2) (5), the cooling section 32 (6), the wafer transfer means MA1 (7), the coating unit 4 (8), the wafer transfer means MA1 (9), the heating section 31 of the shelf unit R2 (R1) (10), the cooling section 32 (11), the wafer transfer means MA2 (MA1) (12), the delivery table 60 of the delivery unit 6 (13), the delivery arm 70 of the interface station S3 (14), the aligner S4, the delivery arm 70, the CHP device 7, the delivery arm 70, the delivery table 60 of the delivery unit 6 (15), the wafer transfer means MA2 (MA1) (16), the developing unit 5B (5A, 5C) (17), the wafer transfer means MA2 (MA1) (18), the heating section 31 of the shelf unit R3 (R2, R1) (19), the cooling section 32 (20), the wafer transfer means MA2 (MA1) (21), the output delivery section 33 of the shelf unit R2 (26), and the delivery arm 23 (27).

In the case where the number of the wafer transfer means MA is two or less as described above, even when the input delivery section and the output delivery section are provided separately in any of the shelf units R, the transfer routes of the wafer W do not overlap each other, thus avoiding waste in transfer, shortening transfer time, and improving a throughput. In this case, the input delivery section and the output delivery section may be provided in the same shelf unit R or may be provided in different shelf units R. Further, as in the aforesaid example, the delivery section 33 of one of the shelf units R1 and R3 on both sides as seen from the cassette station S1 may be structured as the input delivery section 33, and the delivery section 33 of the other shelf unit may be structured as the output delivery section.

In the above description, in the present invention, the processing sections housing the antireflection film forming unit(s) 3, the coating unit(s) 4, the developing unit(s) 5, and the delivery unit 6 may be three-tiered or four-tiered, and three or more processing sections may be arranged at one tier. According to the aforesaid arrangements, the numbers of the antireflection film forming units 3, the coating units 4, the developing units 5 allocated the processing sections are suitably selected, and further the numbers of the shelf units R and the wafer transfer means MA can be suitably increased or decreased.

Furthermore, the numbers of the heating sections 31 and cooling sections 32 of the shelf units R, and the CHP devices 7 are not limited to the aforesaid examples, and the CHP device 7 may be provided in the shelf units R, and the wafer W may be heated and cooled in the CHP device 7 after the antireflection film is formed or after the resist is applied. In this case, the CHP device also corresponds to the pre- and post-processing section.

In the case where the number of the wafer transfer means is three or more, it is preferable to use one of the shelf units R on both sides of the cassette station S1 as the input delivery section 33 and to use the other shelf unit as the output delivery section 33 in terms of avoidance of waste in transfer, but such structure is not necessarily needed, and the input delivery section 33 and the output delivery section 33 may be provided separately in any of the shelf units R. Regardless of the number of the wafer transfer means MA, the output and input delivery section 33 serving both as input and output delivery sections may be provided in any of the shelf units R.

Further, in the present invention, the wafer transfer means MA may not be necessarily laid out so as to get access to two adjacent shelf units R. For example, the wafer W may be delivered between the wafer transfer means MA via the delivery unit 6. When the number of the wafer transfer means MA is two or less, a delivery section for delivering the wafer W between the wafer transfer means MA may be provided in addition to the delivery unit 6 in the processing sections, or the wafer W may be delivered via the vacant antireflection film forming unit 3 or the like.

Furthermore, the present invention may be applied to a case where hydrophobic processing is performed in place of the case where the antireflection film is formed. In this case, for example, a hydrophobic processing section constituting a pre- and post-processing section is provided in the shelf unit R, and after hydrophobic processing is performed in this section, coating of the resist is performed in the coating unit 4.

Figure 11:
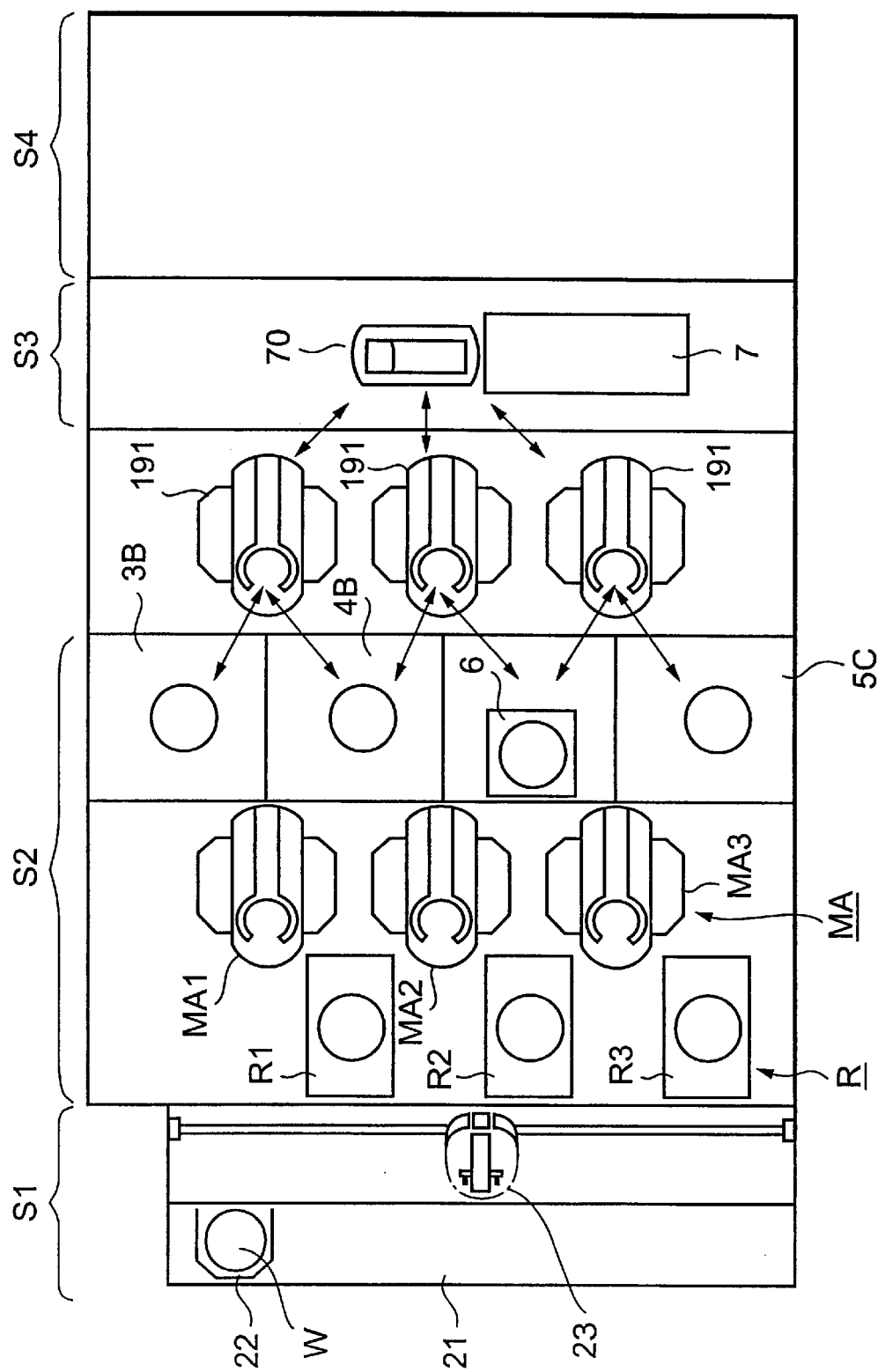
FIG. 11 is a schematic plan view showing a coating and developing apparatus according to another embodiment of the present invention.
Figure 12:
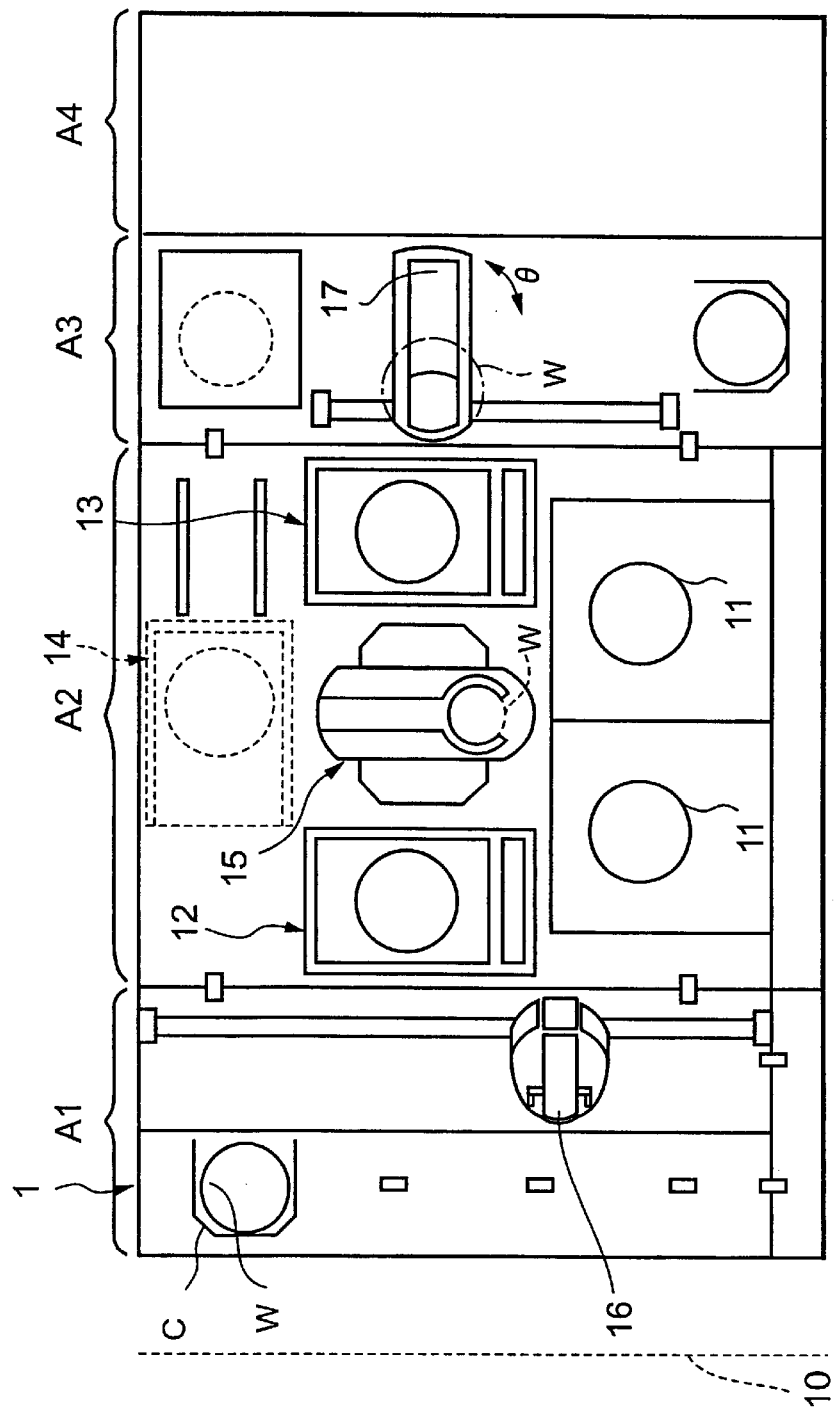
FIG. 12 is a schematic plan view showing a conventional coating and developing apparatus.

As shown in FIG. 11, a plurality of wafer transfer means 191 capable of getting access to the processing sections 3A, 4A, and the like may be provided between the interface station S3 and the processing station S2.

Further, in the present invention, a substrate is not limited to the wafer, but may be a glass substrate for a liquid crystal display.

According to the present invention, the processing sections are arranged in the direction parallel to the direction of arrangement of the substrate cassettes mounted on the mounting section, and hence processing sections can be added without changing the length of the processing station in the direction orthogonal to the direction of arrangement of the substrate cassettes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus, comprising:
    a cassette station including a mounting section for mounting a plurality of cassettes housing substrates thereon such that the cassettes can be arranged in series and substantially flush with one another, a first transfer channel provided along the mounting section and extending in a longitudinal direction of the mounting section, and delivery means, movably provided in the first transfer channel, for unloading and loading the substrates from/to the cassettes mounted on the mounting section;

a processing stat ion, connected to said cassette station, for processing the substrate transferred by the delivery means; and a second transfer channel provided in the processing station and extending in the same direction as the cassette station and the first transfer channel, said processing station including:

a plurality of processing sections arranged in a direction parallel to the direction of arrangement of the cassettes mounted on the mounting section and extending in the same direction as the cassette station, and a delivery unit movably provided in the second transfer channel, for transferring t he substrates to the processing sections.

2. The apparatus as set forth in claim 1, wherein said processing station includes substrate transfer means for receiving and sending the substrate from/to the processing sections.

3. The apparatus as set forth in claim 1, wherein said processing station includes a shelf section in which a plurality of pre- and post-processing sections for performing pre-processing and/or post-processing for processing in the processing sections are vertically arranged.

4. The apparatus as set forth in claim 1, wherein said processing station includes:

a plurality of substrate transfer means, arranged in a direction parallel to the direction of arrangement of the processing sections, for receiving and sending the substrate from/to the processing sections; and a plurality of shelf sections arranged in the direction parallel to the direction of arrangement of the processing sections, in each of which a plurality of pre- and post-processing sections for performing pre-processing and/or post-processing for processing in the processing sections are vertically arranged.

5. The apparatus as set forth in claim 4, wherein at least one of the substrate transfer means is structured to be allowed to receive and send the substrate from/to both of the adjacent two processing sections.

6. The apparatus as set forth in claim 4, wherein said processing station includes two or less substrate transfer means, and the shelf section includes an input delivery section for delivering the substrate from said cassette station to said processing station and an output delivery section for delivering the substrate from said processing station to said cassette station separately.

7. The apparatus as set forth in claim 4, wherein said processing station includes three or more substrate transfer means, and one of the shelf sections on both sides as seen from said cassette station includes an input delivery section for delivering the substrate from said cassette station to said processing station and the other shelf section includes an output delivery section for delivering the substrate from said processing station to said cassette station.

8. The apparatus as set forth in claim 1, wherein said processing station includes:

a shelf section arranged on said cassette station side;

the processing sections arranged to face the shelf section on the opposite side to said cassette station side; and substrate transfer means arranged to face the shelf section and the processing sections between the shelf section and the processing sections.

9. The apparatus as set forth in claim 1, wherein said processing section is to perform coating processing for the substrate.

10. The apparatus as set forth in claim 1, wherein an aligner is allowed to be connected on the opposite side to said cassette station of said processing station, said apparatus, further comprising an interface station, connected to the side opposite to said cassette station of said processing station, for delivering the substrate between said processing station and the aligner, wherein the processing sections includes a processing section for performing coating processing of a resist solution for the substrate and a processing section for performing developing processing for the substrate exposed in the aligner.

11. A substrate processing apparatus which is allowed to connect with an aligner for performing exposure processing for a substrate, comprising:

a cassette station including a mounting section for mounting a plurality of cassettes housing substrates thereon, such that the cassettes can be arranged in series and substantially flush with one another, a first transfer channel provided along the mounting section and extending in a longitudinal direction of the mounting section, and delivery means movably provided in the first transfer channel, for unloading and loading the substrates from/to the cassettes mounted on the mounting section;

a processing station, connected to said cassette station, for processing the substrate transferred by the delivery means; and an interface station, connected to the side opposite to said cassette station of said processing station, for delivering the substrate between said processing station and the aligner, said processing station including:

a plurality of first processing sections arranged adjacent to said cassette station in a direction parallel to the direction of arrangement of the cassettes mounted on the mounting section and extending in the same direction as the cassette station;

a plurality of second processing sections arranged adjacent to said interface station in the direction parallel to the arrangement of the cassettes mounted on the mounting section and extending in the same direction as the cassette station;

a second transfer port disposed between the first processing sections and the second processing sections and extending in the same direction as the cassette station and the first transfer channel;

a substrate transfer device movably provided in the second transfer channel, for transferring the substrate between these processing sections;

a first delivery port provided on the substrate transfer device side in at least one of the second processing sections; and a second delivery port provided on the interface station side in at least one of the second processing sections.

12. The apparatus as set forth in claim 11, wherein at least one of the first processing sections performs thermal processing for the wafer, and wherein at least one of the second processing sections performs solution processing for the substrate.

13. The apparatus as set forth in claim 11, wherein a first and a second shutter member are provided respectively in the first and the second delivery port of the delivery unit, and wherein at least one of the first and the second shutter closes the delivery port.

14. A substrate processing apparatus, comprising:

a cassette station including a mounting section for mounting a plurality of cassettes housing substrates thereon and delivery means for receiving and sending the substrate from/to the plurality of cassettes mounted on the mounting section; and a processing station, connected to said cassette station, for processing the substrate transferred by the delivery means, said processing station including a plurality of processing sections each arranged in a plane that is generally parallel to a plane in which the plurality of cassettes are mounted on the mounting section.

* * * * *